United States Patent
Wu et al.

(10) Patent No.: US 11,398,546 B2
(45) Date of Patent: Jul. 26, 2022

(54) SEMICONDUCTOR DEVICES AND METHODS FOR FABRICATING THE SAME

(71) Applicant: Vanguard International Semiconductor Corporation, Hsinchu (TW)

(72) Inventors: Chun-Yi Wu, Taichung (TW); Chih-Yen Chen, Tainan (TW); Chang-Xiang Hung, Budai Township (TW); Chia-Ching Huang, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 22 days.

(21) Appl. No.: 16/532,628

(22) Filed: Aug. 6, 2019

(65) Prior Publication Data

US 2021/0043724 A1 Feb. 11, 2021

(51) Int. Cl.
*H01L 29/40* (2006.01)
*H01L 29/06* (2006.01)
(Continued)

(52) U.S. Cl.
CPC ...... *H01L 29/0615* (2013.01); *H01L 29/0692* (2013.01); *H01L 29/401* (2013.01);
(Continued)

(58) Field of Classification Search
CPC ............. H01L 29/0615; H01L 29/0692; H01L 29/401; H01L 29/404; H01L 29/66462; H01L 29/7787
See application file for complete search history.

(56) References Cited

U.S. PATENT DOCUMENTS 9,306,014 B1 * 4/2016 Kudymov ............. H01L 29/404
2014/0151749 A1 * 6/2014 Jeon ..................... H01L 29/7786
257/194

(Continued)

FOREIGN PATENT DOCUMENTS

TW 201242026 A1 10/2012
TW 201324773 A1 6/2013
(Continued)

OTHER PUBLICATIONS

Office Action for TW Patent Application No. 108115971 dated Jul. 11, 2019.

*Primary Examiner* — Vongsavanh Sengdara
(74) *Attorney, Agent, or Firm* — Birch, Stewart, Kolasch & Birch, LLP

(57) ABSTRACT

A semiconductor device is provided. The semiconductor device includes a channel layer disposed over a substrate, a barrier layer disposed over the channel layer, a compound semiconductor layer disposed over the barrier layer, a gate electrode disposed over the compound semiconductor layer, and a source electrode and a drain electrode disposed on opposite sides of the gate electrode. The source electrode and the drain electrode penetrate through at least a portion of the barrier layer. The semiconductor device also includes a source field plate connected to the source electrode through a source contact. The semiconductor device further includes a first electric field redistribution pattern disposed on the barrier layer and directly under the edge of the source field plate.

13 Claims, 9 Drawing Sheets

(51) Int. Cl.
*H01L 29/66* (2006.01)
*H01L 29/778* (2006.01)

(52) U.S. Cl.
CPC ...... *H01L 29/404* (2013.01); *H01L 29/66462* (2013.01); *H01L 29/7787* (2013.01)

(56) References Cited

U.S. PATENT DOCUMENTS

| | | | | |
|---|---|---|---|---|
| 2014/0264431 | A1* | 9/2014 | Lal | H01L 29/4175 257/195 |
| 2015/0270379 | A1* | 9/2015 | Kuraguchi | H01L 29/7786 257/194 |
| 2016/0190297 | A1* | 6/2016 | Kudymov | H01L 29/2003 257/76 |
| 2016/0268410 | A1* | 9/2016 | Onizawa | H01L 29/42376 |
| 2016/0336436 | A1* | 11/2016 | Yang | H01L 29/7786 |
| 2017/0278934 | A1* | 9/2017 | Kajiwara | H01L 29/4175 |
| 2018/0190777 | A1* | 7/2018 | Tomomatsu | H01L 23/4824 |

FOREIGN PATENT DOCUMENTS

| | | |
|---|---|---|
| TW | 201417280 A | 5/2014 |
| TW | 201633538 A | 9/2016 |
| TW | 201731103 A | 9/2017 |

\* cited by examiner

SEMICONDUCTOR DEVICES AND METHODS FOR FABRICATING THE SAME

BACKGROUND

Technical Field

The embodiment of the present disclosure relates to semiconductor devices, and in particular it relates to high electron mobility transistors and methods for fabricating the same.

Description of the Related Art

A high electron mobility transistor (HEMT), also known as a heterostructure field-effect transistor (HFET) or a modulation-doped field-effect transistor (MODFET), is a type of field effect transistor (FET) made of semiconductor materials having different energy gaps. A two-dimensional electron gas (2DEG) layer is formed at the interface between two different semiconductor materials that are adjacent to each other. Due to the high electron mobility of the two-dimensional electron gas, the high electron mobility transistor can have the benefits of high breakdown voltage, high electron mobility, low on-resistance, and low input capacitance, and is therefore suitable for high-power components.

A field plate is typically disposed in the high electric field region of the semiconductor device in order to reduce the peak electric field of the high electric field region. One type of the field plate is connected to the gate electrode (i.e., gate field plate) to reduce the electric field intensity at a side the gate near the drain. Thus, the gate field plate can improve the breakdown voltage of the semiconductor device to allow the semiconductor device to be applied in high voltage operation. Another type of field plate is a field plate connected to the source electrode (i.e., source field plate). The source field plate can reduce gate-to-drain capacitance ($C_{gd}$) due to its voltage independency with respect to the gate voltage, and thus the source field plate can improve the operation speed of the semiconductor device. However, there are still causes that trigger the breakdown of the semiconductor device.

Although existing high electron mobility transistors have been adequate for their intended purposes, they have not been entirely satisfactory in all respects. Therefore, how to effectively reduce the impact of great electric field on the device's reliability is the focus of the current technical development.

BRIEF SUMMARY OF THE DISCLOSURE

Some embodiments of the disclosure provide a semiconductor device. The semiconductor device includes a channel layer disposed over a substrate, a barrier layer disposed over the channel layer, a compound semiconductor layer disposed over the barrier layer, a gate electrode disposed over the compound semiconductor layer, and a source electrode and a drain electrode disposed on opposite sides of the gate electrode. The source electrode and the drain electrode penetrate through at least a portion of the barrier layer. The semiconductor device also includes a source field plate connected to the source electrode through a source contact. The semiconductor device further includes a first electric field redistribution pattern disposed over the barrier layer and directly under the edge of the source field plate.

Some embodiments of the disclosure provide a method for fabricating a semiconductor device. The method includes forming a channel layer over a substrate, forming a barrier layer over the channel layer, forming a compound semiconductor layer over the barrier layer, forming a gate electrode over the compound semiconductor layer, forming a first electric field redistribution pattern over the barrier layer, and forming a source electrode and a drain electrode on opposite sides of the gate electrode. The source electrode and the drain electrode penetrate through at least a portion of the barrier layer. The method further includes forming a source field plate, and the source field plate is connected to the source electrode through a source contact. The source field plate has an edge near the source electrode, and wherein the first electric field redistribution pattern is directly under the edge of the source field plate.

A detailed description is given in the following embodiments with reference to the accompanying drawings.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
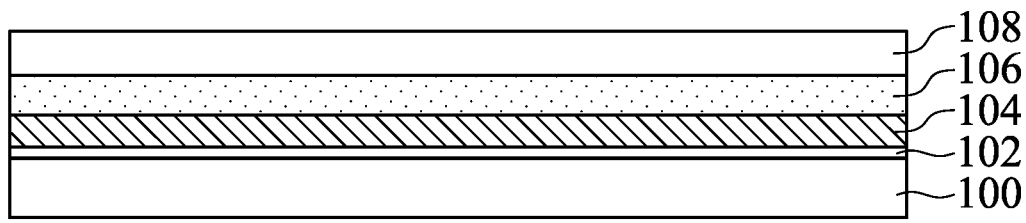
FIGS. 1 to 7 are cross-sectional views illustrating intermediate stages of an exemplary method for forming the semiconductor device of FIG. 7 in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The terms "about", "approximately", and "substantially" used herein generally refer to a value of an error or a range within 40 percent, preferably within 20 percent, and more preferably within 10 percent, within 5 percent, within 3 percent, within 2 percent, or within 1 percent. If there is no specific description, the mentioned values are regarded as an approximation that is the error or the range expressed as "about", "approximate", or "substantially".

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Embodiments of semiconductor device and methods for fabricating the same are provided, especially suited for a high electron mobility transistor (HEMT). Since the electric field intensity directly under the edge of the field plate (for example, the source field plate and/or gate field plate) may be greater than the critical intensity, the material layer may be punched through, and therefore adversely affects the performance of the semiconductor device. In some embodiments of the present disclosure, by disposing an electric field redistribution pattern directly under the edge of the field plate to reduce the two-dimensional electron gas, the electric field intensity directly under the edge of the field plate is decreased. As a result, the breakdown voltage of the semiconductor device may be increased, thereby improving the reliability of the semiconductor device.

Figure 5:
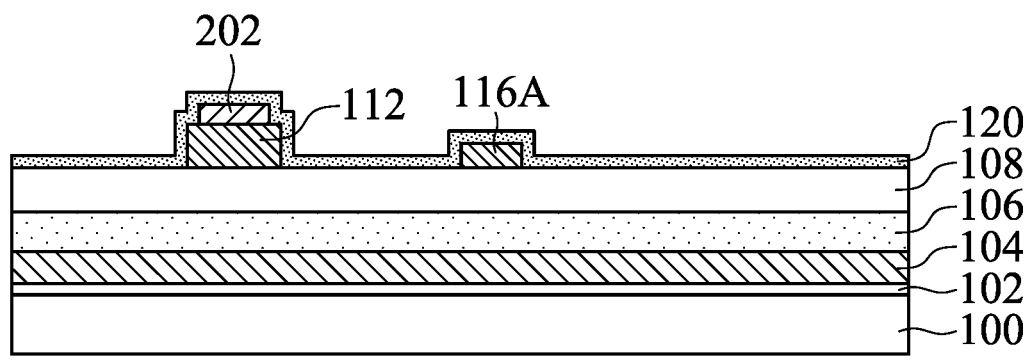
Figure 6:
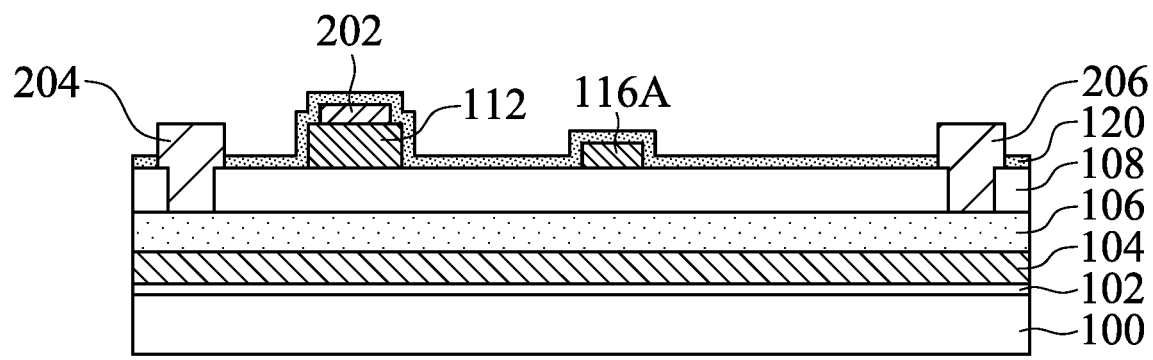
Figure 7:
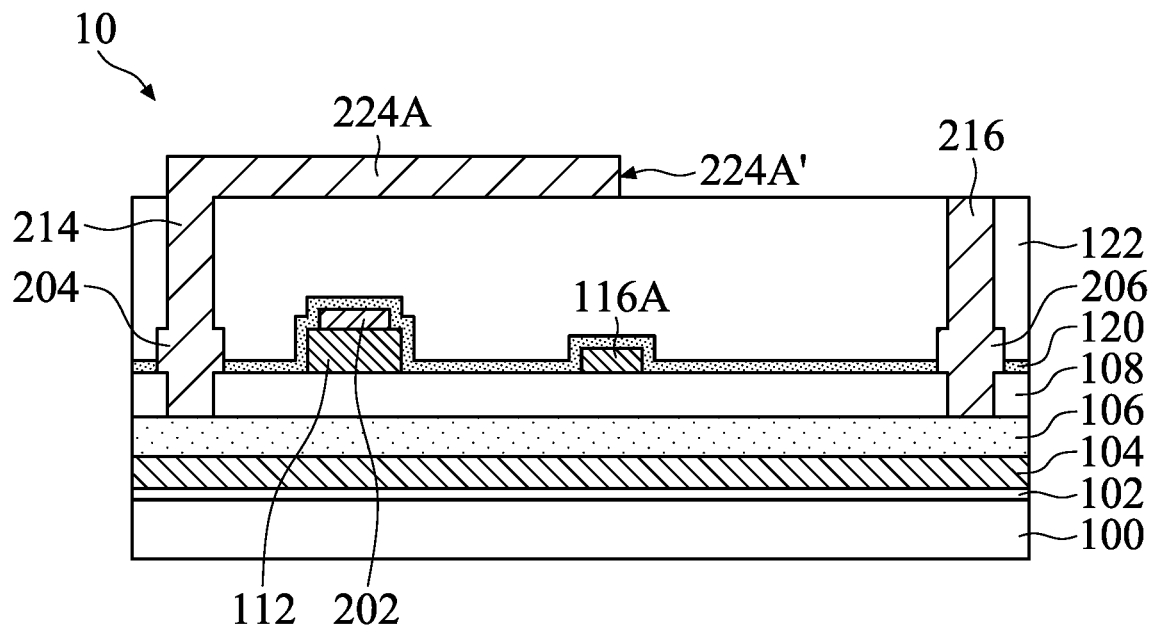

FIGS. 1 to 7 are cross-sectional views illustrating intermediate stages of an exemplary method for forming the semiconductor device 10 of FIG. 7 in accordance with some embodiments. In the embodiments shown in FIGS. 1-7, the electric field redistribution pattern is compound semiconductor bumps.

FIG. 1 illustrates an initial step of a method for forming the electric field redistribution pattern according to an embodiment of the present disclosure. As shown in FIG. 1, a substrate 100 is provided. Next, a buffer layer 104 is formed over the substrate 100, a channel layer 106 is formed over the buffer layer 104, and a barrier layer 108 is formed over the channel layer 106. In some embodiments, a nucleation layer 102 may be formed between the substrate 100 and the buffer layer 104, as shown in FIG. 1.

The substrate 100 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a silicon oxide layer, a silicon nitride layer, a polysilicon layer, or a stacked combination thereof. Other substrates, such as a multi-layered or gradient substrate may also be used. In some embodiments, the semiconductor material of the semiconductor substrate may include silicon with different crystal planes, including Si (111) or Si (110). In some embodiments, the substrate 100 may be a semiconductor substrate or a ceramic substrate, such as a gallium nitride (GaN) substrate, a silicon carbide (SiC) substrate, an aluminum nitride (AlN) substrate, or a sapphire substrate.

The nucleation layer 102 may relieve the lattice mismatch between the substrate 100 and layers grown thereon and improve the crystalline quality. The nucleation layer 102 is optional. In some embodiments, the materials of the nucleation layer 102 may be or include aluminum nitride (AlN), aluminum gallium nitride (AlGaN), another applicable material, or a combination thereof. For example, the thickness of the nucleation layer 102 may range from about 1 nanometer (nm) to about 500 nm, such as about 200 nm. In some embodiments, the nucleation layer 102 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

The buffer layer 104 may be helpful in mitigating a strain of the channel layer 106 which is subsequently formed on the buffer layer 104, and to prevent defects from forming in the overlying channel layer 106. The strain is caused by a mismatch between the channel layer 106 and the substrate 100. In other embodiments, as mentioned above, the buffer layer 104 may be formed directly on the substrate without the nucleation layer 102, to simplify the process steps, and the performance may be improved as well. In some embodiments, the materials of the buffer layer 104 may include a Group III-V compound semiconductor material, such as a Group III nitride. For example, the materials of the buffer layer 104 may include gallium nitride (GaN), aluminum nitride (AlN), aluminum gallium nitride (AlGaN), aluminum indium nitride (AlInN), another applicable material, or a combination thereof. For example, the thickness of the buffer layer 104 may range from about 500 nm to about 50000 nm. In some embodiments, the buffer layer 104 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

The piezoelectric polarization effect induced by the lattice constant difference of the channel layer 106 and the barrier layer 108 and the spontaneous polarization of the channel layer 106 and the barrier layer 108 may form the two-dimensional electron gas (2DEG, not shown) at a heterogeneous interface between the channel layer 106 and the barrier layer 108. The two-dimensional electron gas is utilized as conductive carriers of a high electron mobility transistor (HEMT). In some embodiments, the channel layer 106 and the barrier layer 108 may have no dopant therein.

In some other embodiments, the channel layer 106 and the barrier layer 108 may be doped, such as with an n-type or a p-type dopant.

In some embodiments, the materials of the channel layer 106 may include one or more Group III-V compound semiconductor materials, such as a Group III nitride. For example, the materials of the channel layer 106 may be or include gallium nitride (GaN), aluminum gallium nitride (AlGaN), aluminum indium nitride (AlInN), indium gallium nitride (InGaN), indium aluminum gallium nitride (InAlGaN), another applicable material, or a combination thereof. In some embodiments, the thickness of the channel layer 106 may range from about 0.05 micrometers (μm) to about 1 such as about 0.4 μm. According to some embodiments, the channel layer 106 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

In some embodiments, the materials of the barrier layer 108 may include a Group III-V compound semiconductor material, such as a Group III nitride. For example, the barrier layer 108 may be or include aluminum nitride (AlN), aluminum gallium nitride (AlGaN), aluminum indium nitride (AlInN), aluminum gallium indium nitride (AlGaInN), another applicable material, or a combination thereof. The barrier layer 108 may include a single layer or a multilayer structure. In some embodiments, the thickness of the barrier layer 108 may range from about 3 nm to about 100 nm, such as about 12 nm. In some embodiments, the barrier layer 108 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

Figure 2:
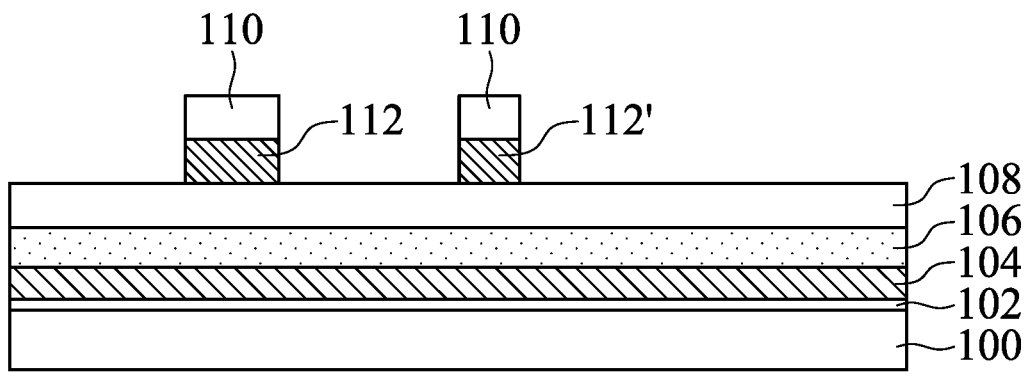

FIG. 2 illustrates the formation of the compound semiconductor layer 112 and the compound semiconductor layer 112'. The gate electrode 202 is to be formed over the compound semiconductor layer 112 in the subsequent processes (not illustrated in FIG. 2 but illustrated and described below with respect to FIG. 4). The generation of two-dimensional electron gas under the gate electrode 202 can be inhibited by the compound semiconductor layer 112 to attain a normally-off status for the semiconductor device. The compound semiconductor layer 112' corresponds to the position of the edge 224A' of the first source field plate 224A to be formed (not illustrated in FIG. 2 but illustrated and described below with respect to FIG. 7), and the compound semiconductor layer 112' will be processed into the compound semiconductor bump 116A in the subsequent processes to act as the electric field redistribution pattern for reducing the electric field of the semiconductor device 10.

In some embodiments, the materials of the compound semiconductor layer 112 and the compound semiconductor layer 112' may be n-type or p-type doped gallium nitride (GaN). For example, the thickness of the compound semiconductor layer 112 may range from about 50 nm to about 100 nm, such as 80 nm, and the width of the compound semiconductor layer 112 may range from about 0.1 μm to about 3 such as about 1.5 μm. In some embodiments, the compound semiconductor layer 112 and the compound semiconductor layer 112' have the same thickness and the same width. In other embodiments, the width of the compound semiconductor layer 112' is less than the width of the compound semiconductor layer 112. For example, the width of the compound semiconductor layer 112' may range from about 0.1 μm to about 3 such as about 0.5 μm.

In some embodiments, the compound semiconductor layer 112 and the compound semiconductor layer 112' may be formed by a deposition process and a patterning process. For example, the deposition process may be used to form a compound semiconductor material layer on the barrier layer 108. In some embodiments, the patterning process includes forming a patterned mask layer 110 on the compound semiconductor material layer, and etching a portion of the compound semiconductor material layer that is not covered by the patterned mask layer 110, thereby forming the compound semiconductor layer 112 and the compound semiconductor layer 112'. In some embodiments, the compound semiconductor layer 112 and the compound semiconductor layer 112' may have a rectangular shape in the cross-sectional view (as shown in FIG. 2) or they may have another shape, such as a trapezoidal shape, in the cross-sectional view. In some embodiments, the upper surfaces of the compound semiconductor layer 112 and the compound semiconductor layer 112' may be uneven.

In some embodiments, the deposition process may include metal organic chemical vapor deposition (MOCVD), atomic layer deposition (ALD), molecular beam epitaxy (MBE), liquid phase epitaxy (LPE), another applicable process, or a combination thereof.

In some embodiments, the patterned mask layer 110 may be a photoresist, such as a positive photoresist or a negative photoresist. In other embodiments, the patterned mask layer 110 may be a hard mask, such as silicon oxide, silicon nitride, silicon oxynitride, silicon carbide, silicon carbon nitride, the like, or a combination thereof. In some embodiments, the patterned mask layer 110 may be formed by spin-on coating, physical vapor deposition (PVD), chemical vapor deposition (CVD), another applicable process, or a combination thereof.

In some embodiments, the compound semiconductor material layer may be etched by using a dry etch process, a wet etch process, or a combination thereof. For example, the compound semiconductor material layer may be etched by reactive ion etching (RIE), inductively-coupled plasma (ICP) etching, neutral beam etching (NBE), electron cyclotron resonance (ERC) etching, another applicable process, or a combination thereof.

Figure 3:
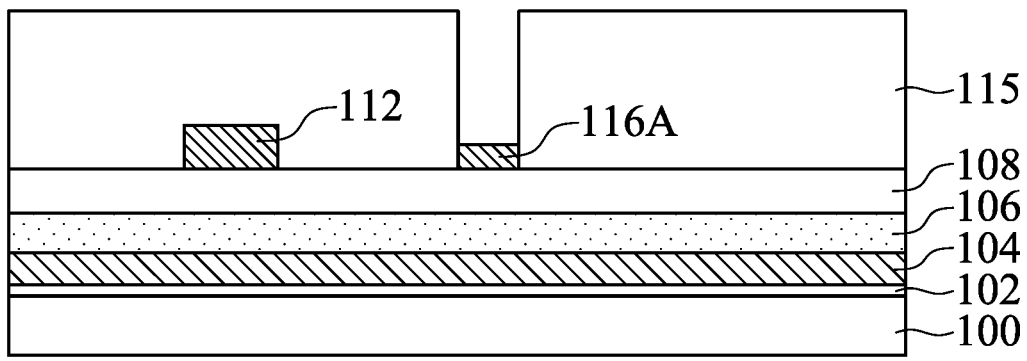

Next, referring to FIG. 3, a thin-down process is performed on the compound semiconductor layer 112' to form a first compound semiconductor bump 116A which is directly under the edge 224A' of the first source field plate 224A to be formed (not illustrated in FIG. 3 but illustrated and described below with respect to FIG. 7). For example, the thin-down process includes forming a patterned mask layer 115 having an opening that corresponds to the compound semiconductor layer 112' on the barrier layer 108, wherein the patterned mask layer 115 covers the compound semiconductor layer 112 and exposes the top surface of the compound semiconductor layer 112'. Then, an etching process may be performed to etch a portion of the compound semiconductor layer 112' that is exposed from the opening of the patterned mask layer 115 to thin down the thickness of the compound semiconductor layer 112', thereby forming the first compound semiconductor bump 116A. In other words, the thickness of the first compound semiconductor bump 116A is less than the thickness of the compound semiconductor layer 112. Since the first compound semiconductor bump 116A has less thickness, the first compound semiconductor bump 116A can act as an electric field redistribution pattern to deplete the two-dimensional electron gas without cutting off the conductive path of the two-dimensional electron gas, thereby reducing the electric field.

In some embodiments, the thickness of the first compound semiconductor bump 116A is about one-eighth of the thickness of the compound semiconductor layer 112. For example, the thickness of the first compound semiconductor bump 116A may range from about 1 nm to about 80 nm, such as about 10 nm.

In some embodiments, the fabrication process and the materials of the patterned mask layer 115 may be similar to the fabrication process and the materials of the patterned mask layer 110 mentioned above with respect to FIG. 2, and therefore are not repeated here. In some embodiments, the etching process may be similar to the etching process mentioned above with respect to FIG. 2, and therefore are not repeated here.

Figure 4:
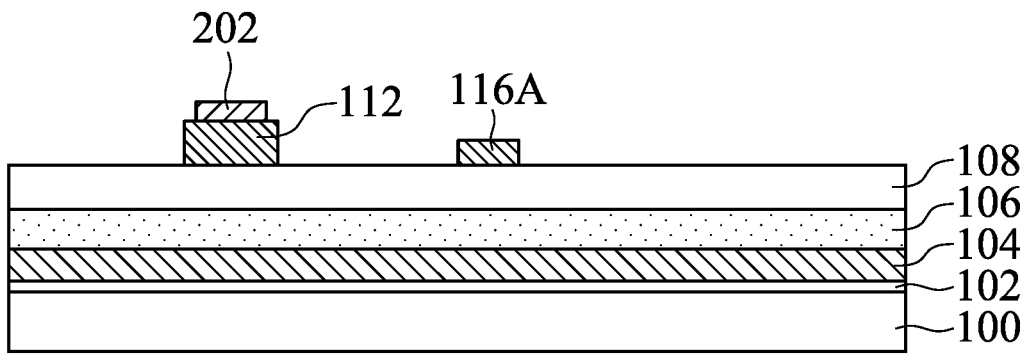

Referring to FIG. 4, the gate electrode 202 is formed on the compound semiconductor layer 112. In some embodiments, the materials of the gate electrode 202 may be or include a conductive material, such as a metal material, a metal silicide, a semiconductor material, or a combination thereof. For example, the metal material may be gold (Au), nickel (Ni), platinum (Pt), palladium (Pd), iridium (Ir), titanium (Ti), chromium (Cr), tungsten (W), aluminum (Al), copper (Cu), TiN, the like, a combination thereof, or multilayers thereof. The semiconductor material may be a polysilicon or a poly-germanium. In some embodiments, the steps of forming the gate electrode 202 may include globally depositing a conductive material layer (not shown) for the gate electrode 202 over the substrate 100, and performing a patterning process on the conductive material layer to form the gate electrode 202 on the compound semiconductor layer 112. The deposition process for forming the conductive material layer may be atomic layer deposition (ALD), chemical vapor deposition (CVD), physical vapor deposition (PVD) such as sputtering, a combination thereof, or the like.

Still referring to FIG. 5, a protection layer 120 is formed conformally along the gate electrode 202, the compound semiconductor layer 112, the first compound semiconductor bump 116A, and the barrier layer 108. Since the sidewalls of the compound semiconductor layer 112 may suffer lattice defects due to the aforementioned etching processes, forming the protection layer 120 on the sidewalls of the compound semiconductor layer 112 may repair the lattice defects of the sidewalls of the compound semiconductor layer 112 to reduce the leakage current from the gate of the semiconductor device. Furthermore, the protection layer 120 formed on the top surface of the barrier layer 108 may prevent the barrier layer 108 from surface oxidation, and improve the performance of the semiconductor device.

In some embodiments, the materials of the protection layer 120 may include or be insulation materials or dielectric materials, such as silicon oxide ($SiO_2$), silicon nitride (SiN), silicon oxynitride (SiON), aluminum oxide ($Al_2O_3$), aluminum nitride (AlN), magnesium oxide (MgO), magnesium nitride ($Mg_3N_2$), zinc oxide (ZnO), titanium oxide ($TiO_2$), or a combination thereof. In some embodiments, the materials of the protection layer 120 is nitride or oxide, such as silicon nitride, aluminum nitride, aluminum oxide, another applicable material, or a combination thereof, which preferably repairs the lattice defects of the sidewalls of the compound semiconductor layer 112. In some embodiments, the thickness of the protection layer 120 may range from about 0.5 nm to about 500 nm. In some embodiments, the protection layer 120 may be globally formed on the substrate 100 by using chemical vapor deposition (CVD) such as plasma enhanced CVD (PECVD), atomic layer deposition (ALD), physical vapor deposition (PVD) such as sputtering, or the like.

Next, referring to FIG. 6, a source electrode 204 and a drain electrode 206 are disposed on opposite sides of the gate electrode 202, wherein the source electrode 204 and the drain electrode 206 extend through the protection layer 120 and a portion of the barrier layer 108. In some embodiments, the source electrode 204 and the drain electrode 206 may be formed by performing a patterning process to recess the protection layer 120 and the portion of the barrier layer 108 on opposite sides of the compound semiconductor layer 112 to form a pair of recesses, wherein the pair of the recesses penetrates through the protection layer 120 and extends to the barrier layer 108. Then a conductive material is deposited over the pair of recesses, and the patterning process is performed on the deposited conductive material to form the source electrode 204 and the drain electrode 206 at a predetermined location. The deposition process and the materials of the source electrode 204 and the drain electrode 206 may be similar to the deposition process and the materials of the gate electrode 202, and therefore are not repeated here.

In the embodiment illustrated in FIG. 6, the source electrode 204 and the drain electrode 206 are on the protection layer 120, penetrating through the protection layer 120 and extending to the barrier layer 108, but the present disclosure is not limited thereto. The depth of the source electrode 204 and the drain electrode 206 may be adjusted depending on the required characteristics of the actual product. For example, the source electrode 204 and the drain electrode 206 may also penetrate through the barrier layer 108 and extend into the channel layer 106.

The source electrode 204, the drain electrode 206, and the gate electrode 202 are formed in the different steps as described herein, but the present disclosure is not limited thereto. For example, recesses for the source electrode 204 and the drain electrode 206 may be formed before the formation of the gate electrode 202, and then a deposition process and a patterning process are performed to form the source electrode 204, the drain electrode 206, and the gate electrode 202 at the same time. It should be noted that, when the source electrode 204, the drain electrode 206, and the gate electrode 202 are formed at the same time, the protection layer 120 is formed conformally along the source electrode 204 and the drain electrode 206 as well. In addition, the source electrode 204, the drain electrode 206, and the gate electrode 202 may be formed independently by the same or different processes and materials. Furthermore, the shape of the source electrode 204, the drain electrode 206, and the gate electrode 202 are not limited to the vertical sidewalls as illustrated in the figures, and may have inclined sidewalls or another shape.

Referring to FIG. 7, an interlayer dielectric layer (ILD layer) 122 is formed over the protection layer 120, and the interlayer dielectric layer 122 covers the compound semiconductor layer 112, the first compound semiconductor bump 116A, the gate electrode 202, the source electrode 204, and the drain electrode 206. A source contact 214 connected to the source electrode 204 and a drain contact 216 connected to the drain electrode 206 are formed in the interlayer dielectric layer 122. A first source field plate 224A is formed on the interlayer dielectric layer 122, and the first source field plate 224A is connected to the source electrode 204 through the source contact 214. The first source field plate 224A has a first edge 224A' between the gate electrode 202 and the drain electrode 206. As mentioned earlier, since the electric field intensity directly under the edge (for example, the first edge 224A') of the field plate (for example, the first source field plate 224A) may be greater than the critical intensity, the material layer may be punched through, and therefore adversely affects the performance of the semiconductor device. The two-dimensional electron gas may be reduced by disposing an electric field redistribution pattern (for example, the first compound semiconductor bump 116A) directly under the edge of the field plate, and thus the electric field intensity directly under the edge of the field plate is decreased. As a result, the breakdown voltage of the semiconductor device 10 may be increased, thereby improving the reliability of the semiconductor device 10.

In some embodiments, the interlayer dielectric layer 122 may comprise or be one or more layers of silicon dioxide, a low-k dielectric material, such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), carbon doped silicon oxide, Spin-On-Glass, Spin-On-Polymers, silicon carbon material, a compound thereof, a composite thereof, the like, or a combination thereof. The interlayer dielectric layer 122 may be deposited by any acceptable process, such as chemical vapor deposition (CVD), plasma enhanced CVD (PECVD), another applicable process, or a combination thereof.

In some embodiments, the material of the source contact 214, the drain contact 216, and the first source field plate 224A may include metal materials, such as gold (Au), nickel (Ni), platinum (Pt), palladium (Pd), iridium (Ir), titanium (Ti), chromium (Cr), tungsten (W), aluminum (Al), copper (Cu), TiN, the like, a combination thereof, or multilayers thereof. The steps of forming the source contact 214 and the drain contact 216 may include forming openings (not shown) which correspond to the source contact 214 and the drain contact 216 and penetrate through the interlayer dielectric layer 122 to respectively expose the source electrode 204 and the drain electrode 206 by using a patterning process, depositing a metal material (not shown) over the interlayer dielectric layer 122 to fill the openings, and then performing a planarization process to remove portions of the metal material over the ILD layer 134, thereby forming the source contact 214 and the drain contact 216. Next, the first source field plate 224A may be formed on the interlayer dielectric layer 122 by the deposition process and the patterning process, and the first source field plate 224A is connected to the source electrode 204 through the source contact 214. In the embodiments where the protection layer 120 disposed conformally along the source electrode 204 and the drain electrode 206, the opening formed by the patterning process further penetrates through the protection layer 120 to respectively expose the source electrode 204 and the drain electrode 206.

Figure 14A:
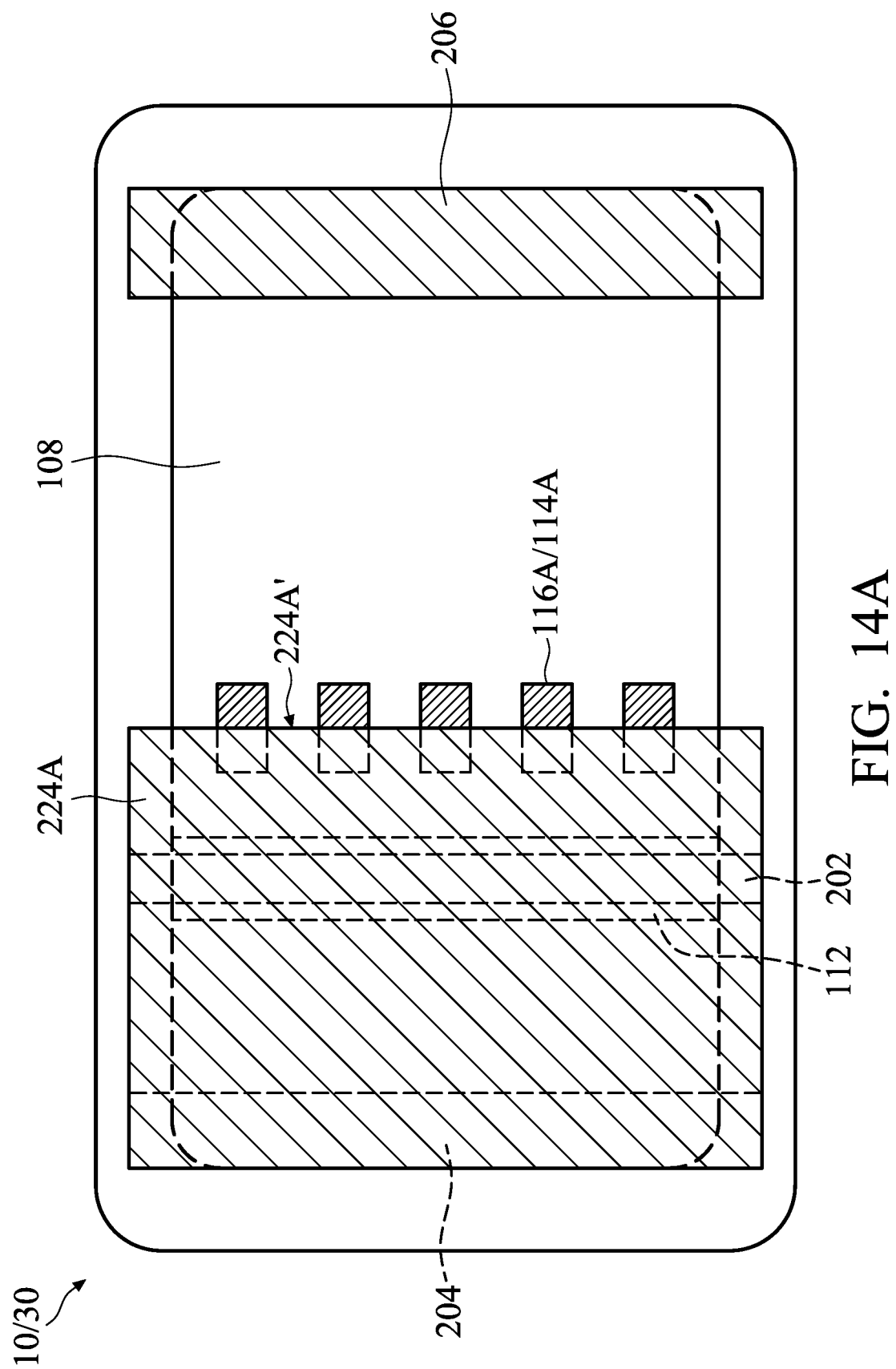
FIG. 14A is a top view of a semiconductor device including an electric field redistribution pattern in accordance with some embodiments of the present disclosure.
Figure 14B:
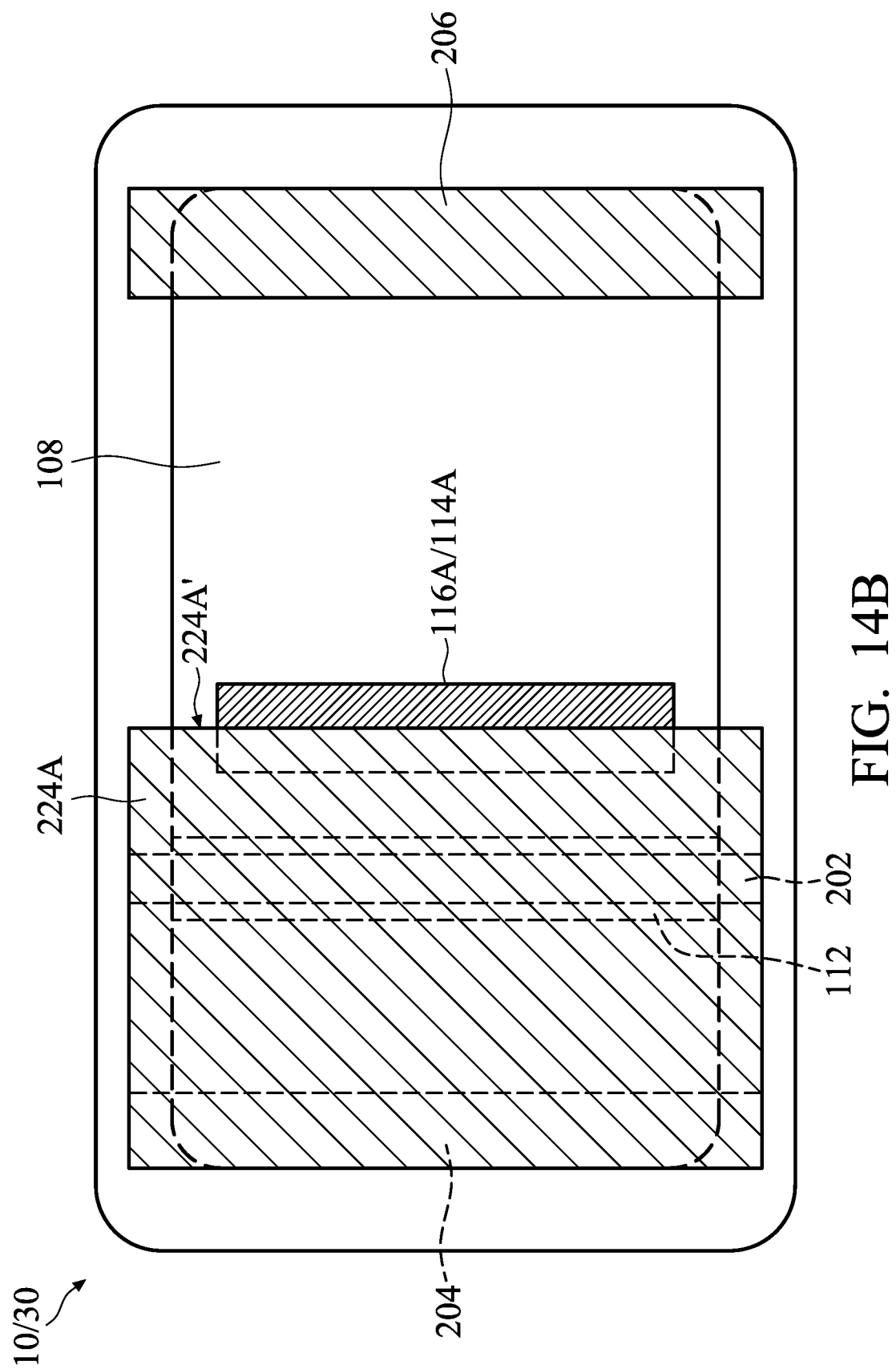
FIG. 14B is a top view of a semiconductor device including an electric field redistribution pattern in accordance with other embodiments of the present disclosure.

FIGS. 14A and 14B illustrate top views of the semiconductor device 10 including the electric field redistribution pattern. In some embodiments, in the top view, the first compound semiconductor bump 116A may be a plurality of discrete bumps directly under the edge 224A' of the first source field plate 224A, that is, the electric field redistribution pattern may be discrete, as shown in FIG. 14A. In other embodiments, in the top view, the first compound semiconductor bump 116A may be a bump in a strip shape directly under the edge 224A' of the first source field plate 224A, that is, the electric field redistribution pattern may be in a strip shape, as shown in FIG. 14B.

As shown in FIG. 7, the semiconductor device 10 includes a channel layer 106 disposed over a substrate 100, a barrier layer 108 disposed over the channel layer 106, a compound semiconductor layer 112 disposed over the barrier layer 108, a gate electrode 202 disposed over the compound semiconductor layer 112, and a source electrode 204 and a drain electrode 206 disposed on opposite sides of the gate electrode 202. The source electrode 204 and the drain electrode 206 penetrate through at least a portion of the barrier layer 108. The semiconductor device 10 also includes a first source field plate 224A connected to the source electrode 204 through a source contact 214, wherein the first source field plate 224A has a first edge 224A'. The semiconductor device 10 further includes a first compound semiconductor bump 116A disposed over the barrier layer 108 and directly under the edge 224A' of the first source field plate 224A. The first compound semiconductor bump 116A can act as the electric field redistribution pattern to deplete the two-dimensional electron gas without cutting off the conductive path of the two-dimensional electron gas, and thereby reducing the electric field intensity directly under the edge 224A' of the first source field plate 224A. As a result, the breakdown voltage of the semiconductor device 10 may be increased, thereby improving the reliability of the semiconductor device 10.

The semiconductor device 10 further includes a protection layer 112 conformally disposed along the gate electrode 202, the compound semiconductor layer 112, and the first electric field redistribution pattern 116A. The protection layer 120 may repair the lattice defects of the sidewalls of the compound semiconductor layer 112 resulting from the etching processes, and the leakage current from the gate of the semiconductor device 10 is reduced. Furthermore, the protection layer 120 may prevent the barrier layer 108 from surface oxidation, and the performance of the semiconductor device 10 is improved.

Figure 8:
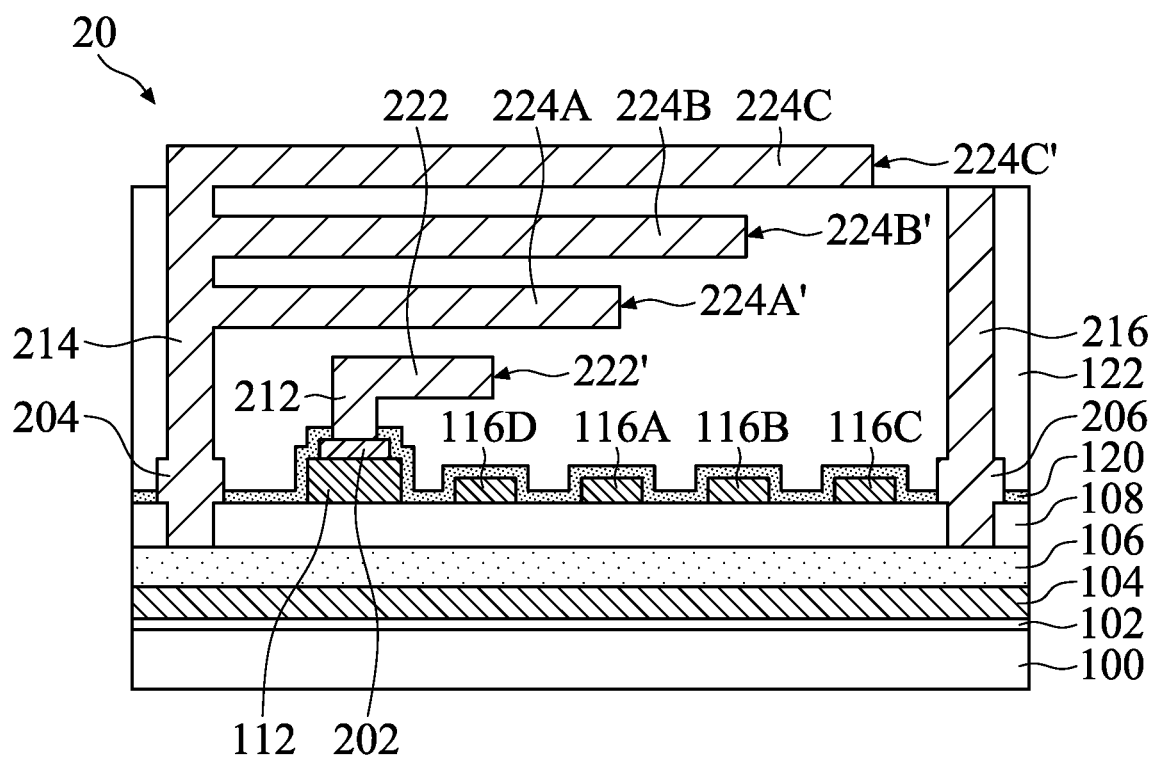
FIG. 8 is a cross-sectional view of a semiconductor device including an electric field redistribution pattern in accordance with some embodiments of the present disclosure.

Although FIG. 7 shows that the semiconductor device 10 only has one field plate (such as the first source field plate 224A), the invention is not limited thereto, and the number of field plate may be adjusted depending on the required characteristics of the actual product. For example, as shown in FIG. 8, the semiconductor device 20 may have a second source field plate 224B, a third source field plate 224C, and a gate field plate 222 additionally, wherein the second source field plate 224B and the third source field plate 224C are connected to the source electrode 204 through the source contact 214, and the gate field plate 222 is connected to the gate electrode 202 through the gate contact 212. In this embodiment, the compound semiconductor bumps may be disposed directly under the edges of these additional field plates. For example, as shown in FIG. 8, a second compound semiconductor bump 116B is disposed directly under the edge 224B' of the second source field plate 224B, a third compound semiconductor bump 116C is disposed directly under the edge 224C' of the third source field plate 224C, and a fourth compound semiconductor bump 116D is disposed directly under the edge 222' of the gate field plate 222.

In some embodiments, the fabrication process and the materials of the second source field plate 224B, the third source field plate 224C, and the gate field plate 222 may be similar to the fabrication process and the materials of the first source field plate 224A mentioned above with respect to FIG. 7, and therefore are not repeated here. The fabrication process and the materials of the second compound semiconductor bump 116B, the third compound semiconductor bump 116C, and the fourth compound semiconductor bump 116D may be similar to the fabrication process and the materials of the first compound semiconductor bump 116A mentioned above with respect to FIGS. 2-4, and therefore are not repeated here. The fabrication process and the materials of the gate contact 212 corresponding to the gate electrode 202 may be similar to the fabrication process and the materials of the source contact 214 mentioned above with respect to FIG. 7, and therefore are not repeated here.

As shown in FIG. 8, in some embodiments, the edge of the field plate is closer to the drain electrode 206 as the field plate is at a higher level. Specifically, the first edge 224A' of the first source field plate 224A is closer to the drain electrode 206 than the edge 222' of the gate field plate 222, the second edge 224B' of the second source field plate 224B is closer to the drain electrode 206 than the first edge 224A' of the first source field plate 224A, and the third edge 224C' of the third source field plate 224C is closer to the drain electrode 206 than the second edge 224B' of the second source field plate 224B. In some embodiments, the first compound semiconductor bump 116A, the second compound semiconductor bump 116B, the third compound semiconductor bump 116C, and the fourth compound semiconductor bump 116D may have the same thickness. Furthermore, in other embodiments, the first compound semiconductor bump 116A, the second compound semiconductor bump 116B, the third compound semiconductor bump 116C, and the fourth compound semiconductor bump 116D may have different thickness, for example, the thickness of the compound semiconductor bump may be thinner as the field plate is at a higher level. Specifically, the thickness of the third compound semiconductor bump 116C is less than the thickness of the second compound semiconductor bump 116B, the thickness of the second compound semiconductor bump 116B is less than the thickness of the first compound semiconductor bump 116A, and the thickness of the first compound semiconductor bump 116A is less than the thickness of the fourth compound semiconductor bump 116D.

Figure 9:
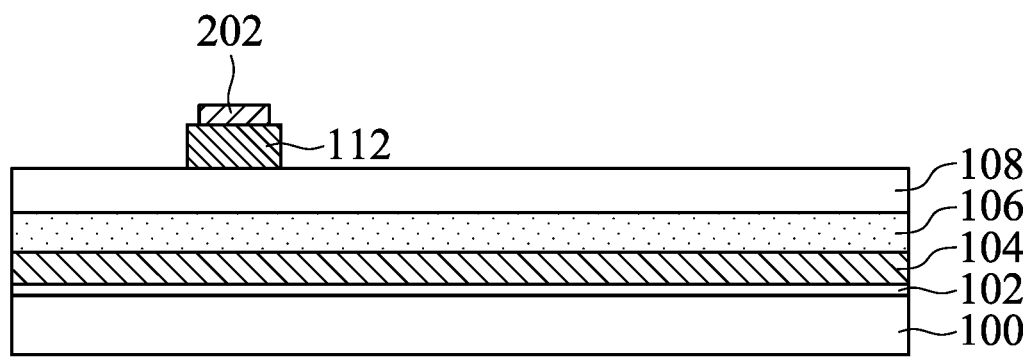
FIGS. 9, 10A, 10B, and 11 are cross-sectional views illustrating intermediate stages of an exemplary method for forming the semiconductor device of FIG. 11 in accordance with other embodiments.
Figure 10A:
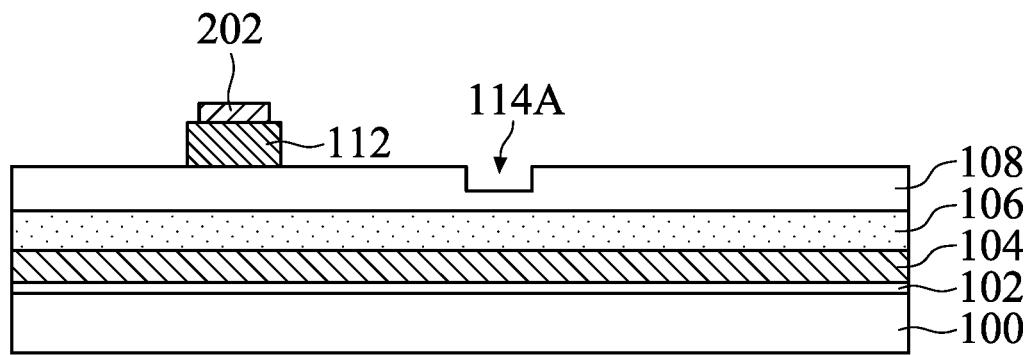
Figure 10B:
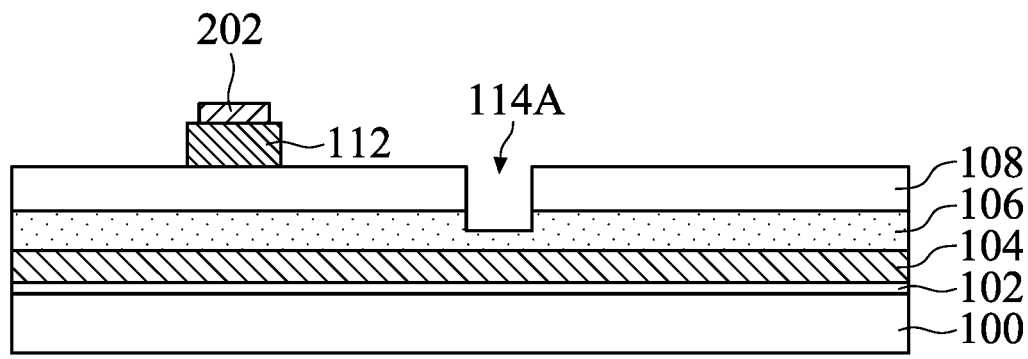
Figure 11:
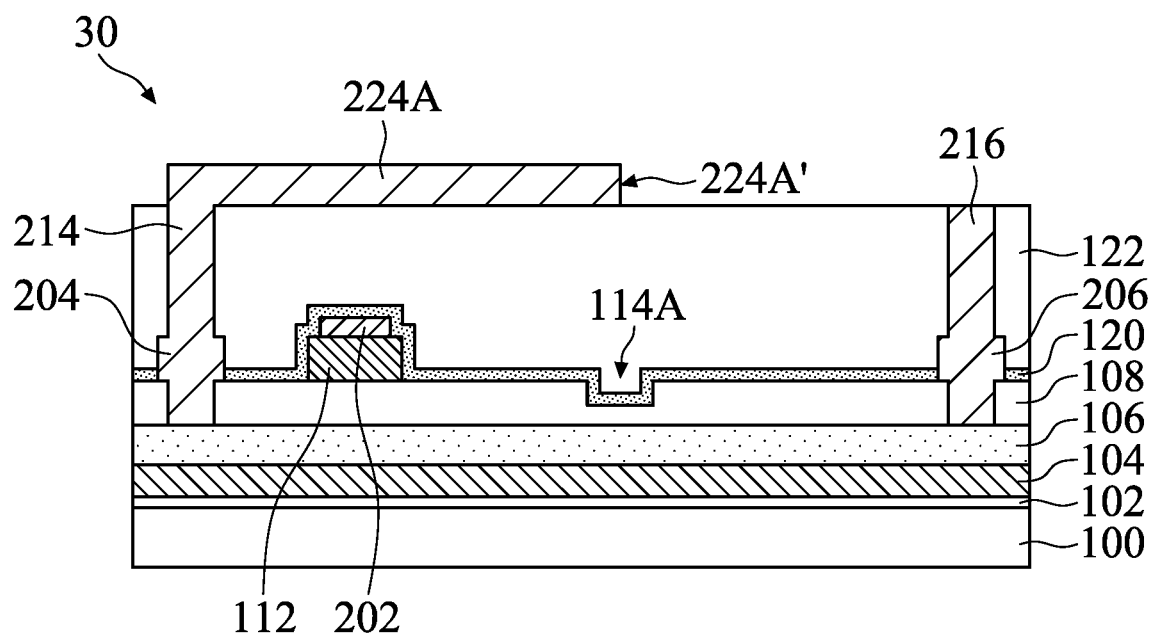

FIGS. 9, 10A, 10B and 11 are cross-sectional views illustrating intermediate stages of another exemplary method for forming a semiconductor device 30 of FIG. 11 in accordance with some embodiments. For the sake of clarity, similar or same elements and processes will be given the same reference numbers. For the purpose of brevity, the descriptions of these processes and devices are not repeated herein.

In the embodiments shown in FIGS. 9, 10A, 10B and 11, the semiconductor device 30 is similar to the semiconductor device 10, except that the electric field redistribution pattern is recesses instead of compound semiconductor bumps.

Referring to FIG. 9, except that the first compound semiconductor bump 116A is not formed over the barrier layer 108, the fabrication processes mentioned above with respect to FIGS. 1-4 are performed to form the structure shown in FIG. 9.

Next, as shown in FIG. 10A, recessing the barrier layer 108 to form a first recess 114A, wherein the first recess 114A extends to the lower surface of the barrier layer 108 from the upper surface of the barrier layer 108. The first recess 114A corresponds to the position of the first edge 224A' of the first source field plate 224A to be formed (not illustrated in FIG. 10A but illustrated and described below with respect to FIG. 11). The portion of the barrier layer 108 under the first recess 114A has a reduced thickness due to the formation of the first recess 114A, which has a benefit of reducing the two-dimensional electron gas under the first recess 114A, thus decreasing the electric field intensity. Therefore, the first recess 114A can act as the electric field redistribution pattern for reducing the electric field of the semiconductor device 30. In some embodiments, the depth of the first recess 114A may range from about 1 nm to about 4 nm, such as about 2 nm.

In some embodiments, a patterning process may be used to recess the barrier layer 108 to form the first recess 114A. For example, the patterning process may include a lithography process (e.g., photoresist coating, soft baking, mask aligning, exposure, post-exposure baking, developing photoresist, another applicable process, or a combination thereof), an etching process (e.g., a wet etching process, a dry etching process, another applicable process, or a combination thereof), another applicable process, or a combination thereof. In some embodiments, a patterned photoresist layer (not shown) having an opening corresponding to the first recess 114A may be formed on the barrier layer 108 by a lithography process, and then an etching process may be performed to remove portions of the barrier layer 108 exposed by the opening of the patterned photoresist layer (not shown) to form the first recess 114A in the barrier layer 108. Then, the patterned photoresist layer is removed by using an ashing process or a wet strip process.

In the embodiment illustrated in FIG. 10A, the first recess 114A only penetrates through a portion of the barrier layer 108, but the present disclosure is not limited thereto. The extending depth of the first recess 114A may be adjusted depending on the required characteristics of the actual product. For example, the first recess 114A may also penetrate through the barrier layer 108 and extend into the channel layer 106, as shown in FIG. 10B.

The following description of the process for forming the semiconductor device 30 is continued with the structure of FIG. 10A. It should be noted that the semiconductor device 30 can also be formed by using the structure of FIG. 10B. Then, a series of processes similar to the processes described in FIGS. 5 to 7 are performed on the structure illustrated in FIG. 10A to complete the semiconductor device 30 illustrated in FIG. 11.

As shown in FIG. 11, the semiconductor device 30 includes a channel layer 106 disposed over a substrate 100, a barrier layer 108 disposed over the channel layer 106, a compound semiconductor layer 112 disposed over the barrier layer 108, a gate electrode 202 disposed over the compound semiconductor layer 112, and a source electrode 204 and a drain electrode 206 disposed on opposite sides of the gate electrode 202. The source electrode 204 and the drain electrode 206 penetrate through at least a portion of the barrier layer 108. The semiconductor device 30 also includes a first source field plate 224A connected to the source electrode 204 through a source contact 214, wherein the first source field plate 224A has a first edge 224A'. The semiconductor device 30 further includes a first recess 114A disposed on the barrier layer 108 and directly under the edge 224A' of the first source field plate 224A. The first recess 114A extends to the lower surface of the barrier layer 108 from the upper surface of the barrier layer 108. The portion of the barrier layer 108 under the first recess 114A has a reduced thickness due to the formation of the first recess 114A, which has a benefit of reducing the two-dimensional electron gas under the first recess 114A, thus decreasing the electric field intensity directly under the first edge 224A' of the first source field plate 224A. As a result, the breakdown voltage of the semiconductor device 30 may be increased, thereby improving the reliability of the semiconductor device 30.

The semiconductor device 30 further includes a protection layer 112 conformally disposed along the gate electrode 202, the compound semiconductor layer 112, and the first recess 114A. The protection layer 120 may repair the lattice defects of the sidewalls of the compound semiconductor layer 112 resulting from the etching processes to reduce the leakage current from the gate of the semiconductor device 30. Furthermore, the protection layer 120 may prevent the barrier layer 108 from surface oxidation, and improve the performance of the semiconductor device 30.

FIGS. 14A and 14B also illustrate top views of the semiconductor device 30 including the electric field redistribution pattern. In some embodiments, in the top view, the first recess 114A may be a plurality of discrete recesses directly under the first edge 224A' of the first source field plate 224A, that is, the electric field redistribution pattern may be discrete, as shown in FIG. 14A. In other embodiments, in the top view, the first recess 114A may be a recess in a strip shape directly under the first edge 224A' of the first source field plate 224A, that is, the electric field redistribution pattern may be in a strip shape, as shown in FIG. 14B. It should be noted that, in the embodiments where the first recess 114A penetrates through the barrier layer 108 and extends into the channel layer 106, since the first recess 114A may cut off the conductive path of the two-dimensional electron gas in these embodiments, the electric field redistribution pattern is discrete in the top view, as shown in FIG. 14A.

Figure 12:
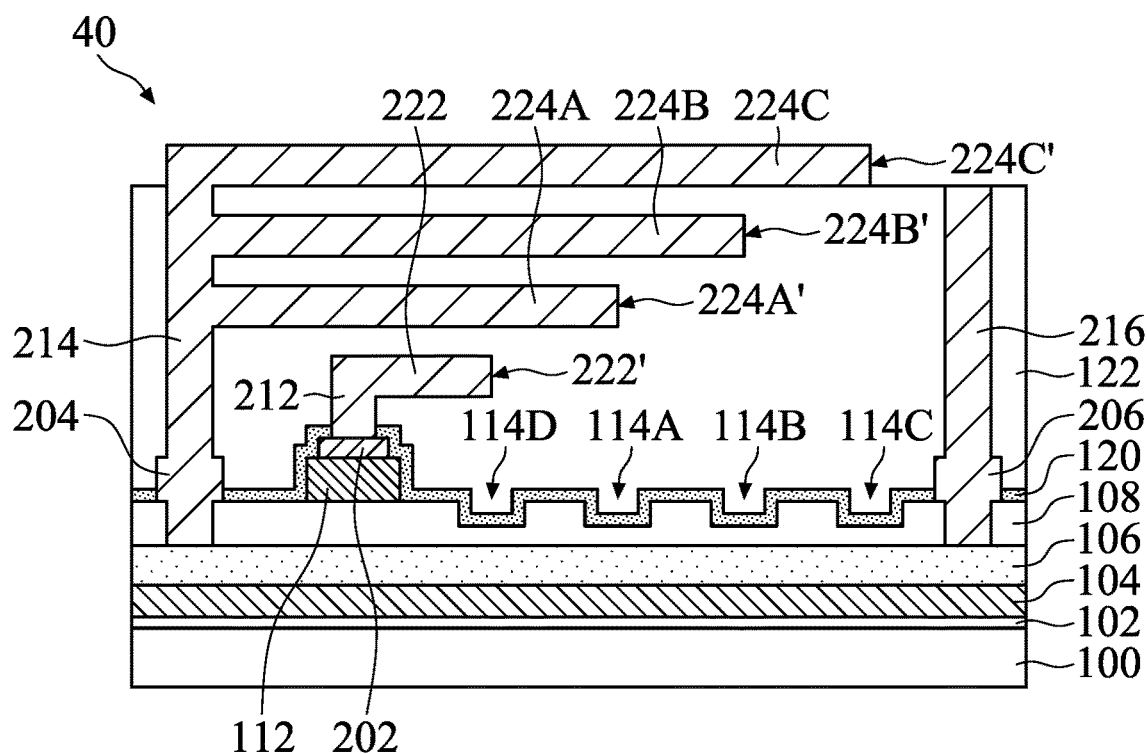
FIG. 12 is a cross-sectional view of a semiconductor device including an electric field redistribution pattern in accordance with other embodiments of the present disclosure.

As mentioned earlier, the number of the field plate of the semiconductor device 30 may be adjusted depending on the required characteristics of the actual product. For example, as shown in FIG. 12, the semiconductor device 40 may have a second source field plate 224B, a third source field plate 224C, and a gate field plate 222 additionally, wherein the second source field plate 224B and the third source field plate 224C are connected to the source electrode 204 through the source contact 214, and the gate field plate 222 is connected to the gate electrode 202 through the gate contact 212. In this embodiment, the recesses may be disposed directly under the edges of these additional field plates. For example, as shown in FIG. 12, a second recess 114B is disposed directly under the second edge 224B' of the second source field plate 224B, a third recess 114C is disposed directly under the third edge 224C' of the third source field plate 224C, and a fourth recess 114D is disposed directly under the edge 222' of the gate field plate 222.

In some embodiments, the fabrication process and the materials of the second source field plate 224B, the third source field plate 224C, and the gate field plate 222 may be similar to the fabrication process and the materials of the first source field plate 224A mentioned above with respect to FIG. 7, and therefore are not repeated here. The fabrication process and the materials of the gate contact 212 of the gate electrode 202 may be similar to the fabrication process and the materials of the source contact 214 mentioned above with respect to FIG. 7, and therefore are not repeated here. The fabrication process and the materials of the second recess 114B, the third recess 114C, and the fourth recess 114D may be similar to the fabrication process and the materials of the first recess 114A mentioned above with respect to FIG. 10A, and therefore are not repeated here.

Referring to FIG. 12, as mentioned earlier, in some embodiments, the edge of the field plate is closer to the drain electrode 206 as the field plate is at a higher level. Specifically, the first edge 224A' of the first source field plate 224A is closer to the drain electrode 206 than the edge 222' of the gate field plate 222, the second edge 224B' of the second source field plate 224B is closer to the drain electrode 206 than the first edge 224A' of the first source field plate 224A, and the third edge 224C' of the third source field plate 224C is closer to the drain electrode 206 than the second edge 224B' of the second source field plate 224B. In some embodiments, the first recess 114A, the second recess 114B, the third recess 114C, and the fourth recess 114D may have the same depth. Furthermore, in other embodiments, the first recess 114A, the second recess 114B, the third recess 114C, and the fourth recess 114D may have different depths, for example, the recess may be shallower as the field plate is at a higher level. Specifically, the depth of the third recess 114C is less than the depth of the second recess 114B, the depth of the second recess 114B is less than the depth of the first recess 114A, and the depth of the first recess 114A is less than the depth of the fourth recess 114D.

Figure 13:
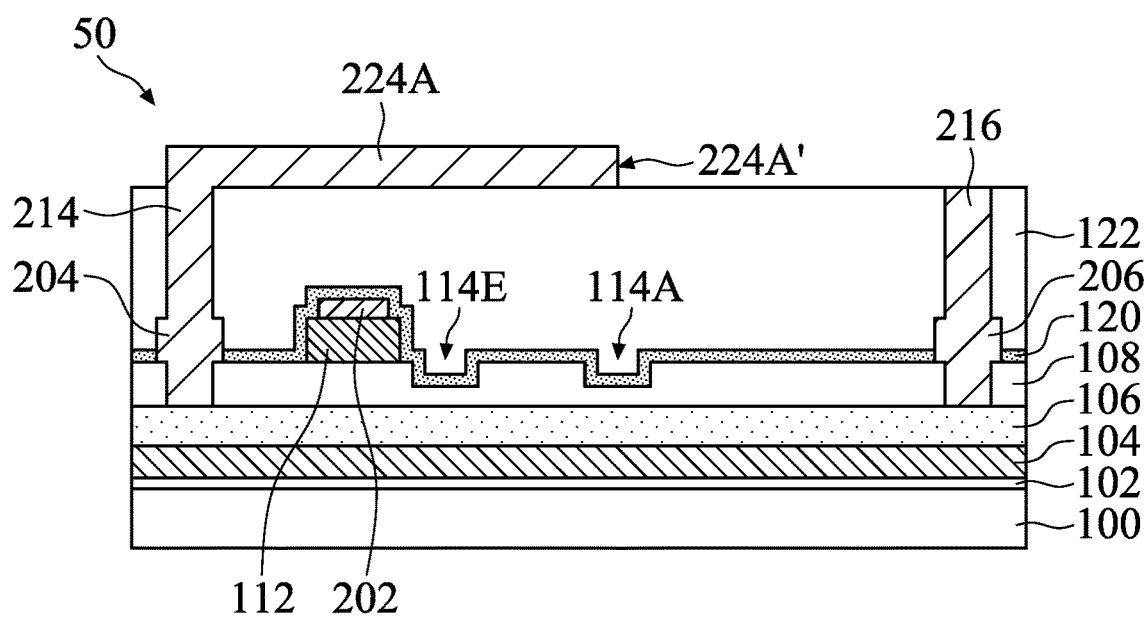
FIG. 13 is a cross-sectional view of a semiconductor device including an electric field redistribution pattern in accordance with other embodiments of the present disclosure.

FIG. 13 is a cross-sectional view illustrating intermediate stages of another exemplary method for forming a semiconductor device 50 in accordance with other embodiments. For the sake of clarity, similar or same elements and processes will be given the same reference numbers. For the purpose of brevity, the descriptions of these processes and devices are not repeated herein. The semiconductor device 50 is similar to the semiconductor device 30, except that a fifth recess 114E is disposed adjacent to the edge of the compound semiconductor layer 112.

Referring to FIG. 13, the fifth recess 114E and the fourth recess 114D are formed at the same time during the formation of the fourth recess 114D. The fifth recess 114E extends to the lower surface of the barrier layer 108 from the upper surface of the barrier layer 108. The fifth recess 114E is disposed between the gate electrode 202 and the drain electrode 206, and adjacent to the edge of the compound semiconductor layer 112. Since there is a strongly polarized electric field under the edge of the compound semiconductor layer 112 due to surface polarization, the material layer is punched through, and therefore adversely affects the performance of the semiconductor device. The effects of surface polarization may be reduced by disposing the fifth recess 114E adjacent to the edge of the compound semiconductor layer 112, and thus the electric field intensity is decreased, thereby improving the reliability of the semiconductor device 50. The fabrication process and the materials of the fifth recess 114E may be similar to the fabrication process and the materials of the first recess 114A mentioned above with respect to FIG. 10A or 10B, and therefore are not repeated here.

In the illustrated embodiments, the semiconductor devices 10/20/30/40/50 each include a single type of the electric field redistribution pattern (such as the compound semiconductor bumps or recesses), but the present disclosure is not limited thereto. These two types of the electric field redistribution patterns may be integrated into the semiconductor device depending on the required characteristics of the actual product. For example, the electric field redistribution pattern in the form of recess may be disposed adjacent to the edge of the compound semiconductor layer 112 (such as the fifth recess 114E), and the electric field redistribution pattern in the form of compound semiconductor bump may be disposed directly under the edges of the field plates (such as the compound semiconductor bumps 116A, 116B, 116C, and/or 116D).

In summary, the semiconductor device according to embodiments of the present disclosure includes the electric field redistribution patterns including compound semiconductor bumps or recesses directly under the edge of the field plate, which are utilized to reduce the two-dimensional electron gas, and the electric field intensity is decreased. As a result, the breakdown voltage of the semiconductor device may be increased, thereby improving the reliability of the semiconductor device. In addition, the semiconductor device according to embodiments of the present disclosure also includes the electric field redistribution patterns including recesses disposed adjacent to the edge of the compound semiconductor layer 112, which is utilized to reduce the effects of surface polarization, and the electric field intensity is decreased, thereby further improving the reliability of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a channel layer disposed over a substrate;
    a barrier layer disposed over the channel layer;
    a compound semiconductor layer disposed over the barrier layer;
    a gate electrode disposed over the compound semiconductor layer;
    a source electrode and a drain electrode disposed on opposite sides of the gate electrode, wherein the source electrode and the drain electrode penetrate through at least a portion of the barrier layer;
    a source field plate connected to the source electrode through a source contact, wherein the source field plate has an edge;
    a gate field plate connected to the gate electrode through a gate contact, wherein the gate field plate has an edge;
    a first electric field redistribution pattern comprising a first compound semiconductor bump and a second compound semiconductor bump disposed over the barrier layer, wherein the first compound semiconductor bump is directly under the edge of the source field plate and the second compound semiconductor bump is directly under the edge of the gate field plate.

2. The semiconductor device of claim 1, wherein a thickness of the at least one of the first compound semiconductor bump and the second compound semiconductor bump is less than a thickness of another one of the first compound semiconductor bump and the second compound semiconductor bump.

3. The semiconductor device of claim 1, wherein the first compound semiconductor bump and the second compound semiconductor bump comprise a same material.

4. The semiconductor device of claim 1, further comprising an additional source field plate, and the additional source field plate is connected to the source electrode through the source contact, wherein an edge of the additional source field plate is closer to the source electrode than the edge of the source field plate, and the first electric field redistribution pattern is further disposed directly under the edge of the additional source field plate.

5. The semiconductor device of claim 1, wherein in a top view, the first electric field redistribution pattern is discrete.

6. The semiconductor device of claim 1, wherein in a top view, the first electric field redistribution pattern is in a strip shape.

7. A method for fabricating the semiconductor device, comprising:
    forming a channel layer over a substrate;
    forming a barrier layer over the channel layer;
    forming a compound semiconductor layer over the barrier layer;
    forming a gate electrode over the compound semiconductor layer;
    forming a first electric field redistribution pattern comprising a first compound semiconductor bump and a second compound semiconductor bump over the barrier layer;
    forming a source electrode and a drain electrode on opposite sides of the gate electrode, wherein the source electrode and the drain electrode penetrate through at least a portion of the barrier layer;
    forming a gate field plate connected to the gate electrode through a gate contact, wherein the gate field plate has an edge; and
    forming a source field plate, and the source field plate is connected to the source electrode through a source contact, wherein the source field plate has an edge, and wherein the first compound semiconductor bump is directly under the edge of the source field plate and the second compound semiconductor bump is directly under the edge of the gate field plate.

8. The method for fabricating a semiconductor device of claim 7, wherein a thickness of one of the first compound semiconductor bump and the second compound semiconductor bump is less than a thickness of another one of the first compound semiconductor bump and the second compound semiconductor bump.

9. The method for fabricating a semiconductor device of claim 7, wherein the first compound semiconductor bump and the second compound semiconductor bump comprise a same material.

10. The method for fabricating a semiconductor device of claim 7, further comprising forming an additional source field plate, and the additional source field plate is connected to the source electrode through the source contact, wherein an edge of the additional source field plate is closer to the source electrode than the edge of the source field plate, and the first electric field redistribution pattern is further disposed directly under the edge of the additional source field plate.

11. The method for fabricating a semiconductor device of claim 7, wherein in a top view, the first electric field redistribution pattern is discrete.

12. The method for fabricating a semiconductor device of claim 7, wherein in a top view, the first electric field redistribution pattern is in a strip shape.

13. The method for fabricating a semiconductor device of claim 7, further comprising conformally forming a protection layer along the gate electrode, the compound semiconductor layer, and the first electric field redistribution pattern.

* * * * *